United States Patent
Shroff et al.

(10) Patent No.: US 8,941,242 B2
(45) Date of Patent: Jan. 27, 2015

(54) METHOD OF PROTECTING AGAINST VIA FAILURE AND STRUCTURE THEREFOR

(75) Inventors: Mehul D. Shroff, Austin, TX (US); Douglas M. Reber, Austin, TX (US); Edward O. Travis, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 18 days.

(21) Appl. No.: 13/313,179

(22) Filed: Dec. 7, 2011

(65) Prior Publication Data

US 2013/0147051 A1 Jun. 13, 2013

(51) Int. Cl.
*H01L 23/48* (2006.01)
*H01L 21/768* (2006.01)

(52) U.S. Cl.
USPC .......................... 257/774; 438/637

(58) Field of Classification Search
CPC ............... H01L 23/48; H01L 21/486
USPC ............ 257/774, E21.578, E23.067
See application file for complete search history.

(56) References Cited

U.S. PATENT DOCUMENTS

| | | | |
|---|---|---|---|
| 5,439,731 A | 8/1995 | Li et al. | |
| 5,581,475 A | 12/1996 | Majors | |
| 5,930,587 A | 7/1999 | Ryan | |
| 6,823,500 B1 | 11/2004 | Ganesh et al. | |
| 6,972,209 B2 * | 12/2005 | Agarwala et al. | 438/52 |
| 7,253,531 B1 * | 8/2007 | Huang et al. | 257/784 |
| 7,915,733 B2 * | 3/2011 | Kudo | 257/758 |
| 2006/0154470 A1 * | 7/2006 | Pozder et al. | 438/618 |
| 2008/0121881 A1 * | 5/2008 | Kaneko et al. | 257/48 |
| 2010/0257502 A1 * | 10/2010 | Matsuoka | 716/11 |

OTHER PUBLICATIONS

Huang, T.C., et al., "Numerical Modeling and Characterization of the Stress Migration Behavior Upon Various 90 nanometer Cu/Low k Interconnects", IEEE, Apr. 2003, pp. 207-209.
Luo, F., et al, "Yield-Preferred Via Insertion Based on Novel Geotopological Technology", IEEE, Aug. 2006, pp. 730-735.
Ogawa, E.T., et al., "Stress-Induced Voiding Under Vias Connected to Wide Cu Metal Leads", IEEE, 40th Annual International Reliability Physics Symposium, Dallas, Texas, Sep. 2002, pp. 312-321.
U.S. Appl. No. 13/285,073, Office Action—Rejection, Mailed Jul. 3, 2013.
U.S. Appl. No. 13/285,073, Office Action—Rejection mailed Jan. 31, 2013.
Office Action mailed Jan. 16, 2014 in U.S. Appl. No. 13/285,073.

* cited by examiner

*Primary Examiner* — Matthew Landau
*Assistant Examiner* — Damon Hillman
(74) *Attorney, Agent, or Firm* — James L. Clingan, Jr.

(57) ABSTRACT

A method is for forming a decoy via and a functional via. The method includes forming the functional via between a metal portion of a first interconnect layer and a portion of a second interconnect layer. The method further includes forming the decoy via in a protection region between the metal portion of the first interconnect layer and a metal portion of the third interconnect level.

9 Claims, 1 Drawing Sheet

METHOD OF PROTECTING AGAINST VIA FAILURE AND STRUCTURE THEREFOR

CROSS-REFERENCE TO RELATED APPLICATION(S)

This application is related to U.S. patent application Ser. No. 13/285,073. that was filed on Oct. 31, 2011. is titled "SEMICONDUCTOR DEVICE WITH VIAS ON A BRIDGE CONNECTING TWO BUSES," names Douglas M. Reber, Mehul D. Shroff, and Edward O. Travis as inventors, and is assigned to the current assignee hereof.

BACKGROUND

1. Field

The invention relates to vias and more particularly to vias used to avoid failures.

2. Related Art

Semiconductor devices often have conductors that have tabs extending laterally from sides of the conductors. These conductors are often considered buses because they are relatively wide for low resistance so as to be able to carry relatively high currents without causing problematic voltage drop. For a given technology, the depth of the lines at a given metal level is the same so that width is the variable in determining resistance per unit of length. Increasing width reduces resistance, but requires more area as well as increasing the risk of stress-induced voiding at the vias. The stress can result in a variety of failures including via failure. Although via failures may have a low probability of occurring, there are often millions of vias on a given semiconductor device. The result is that a likelihood of at least one via failure is relatively high. Thus, it has become common to provide redundant vias with the view that it is unlikely that two vias will fail at the same location. In a situation where the via is on a tab, there are limited options for a redundant via. On the other hand placing a via on the tab provides some inherent protection by distancing the via from the bus which, being wide, results in more vacancies being created.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A semiconductor device includes a bus with a tab having a via on the tab that is susceptible to failure. The semiconductor device is constructed with a first metal interconnect layer, a second metal interconnect layer, and a third interconnect layer. The via that is susceptible to failure is connected between a metal portion that is part of the second interconnect layer and a metal portion that is part of the first interconnect layer. A decoy via is aligned near, within a protection region, to the via that is susceptible to failure and is connected between the metal portion that is a part of the first interconnect layer and a metal portion that is part of the third interconnect layer. Although the decoy via is connected on one end to a different interconnect layer than the via that is susceptible to failure, the two vias have a common connection on the portion of the first interconnect layer so that the decoy via provides gettering of vacancies and thus protects the via that is susceptible to failure when vacancies are coming from the first interconnect layer. This is better understood by reference to the drawings and the following written description.

Figure 1:
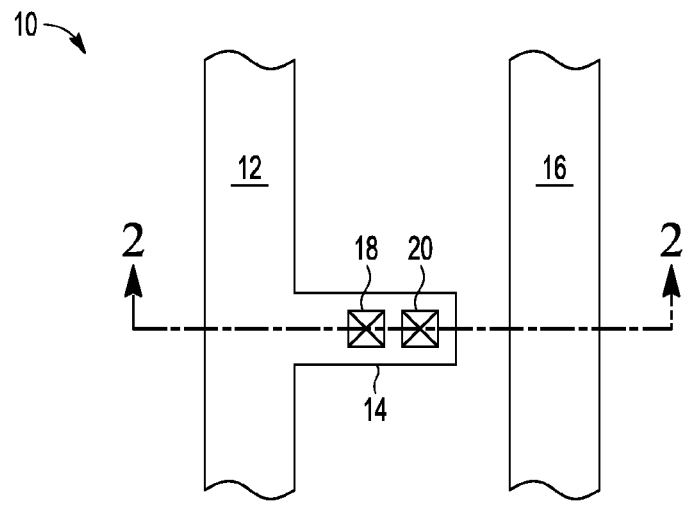
FIG. 1 is a top view of a semiconductor device according to an embodiment.

Shown in FIG. 1 is a semiconductor device having a bus 12 that has a tab 14 extending laterally from a side of the bus. Bus 12 may be twice, or more, as wide as tab 14. Also shown is bus 16 adjacent to tab 14. In effect, bus 16 prevents tab 14 from extending further laterally from the side of bus 12. Connected to tab 14 are both a decoy via 18 extending upward and a functional via 20 extending downward. As an alternative, decoy via 18 may extend downward while functional via 20 may extend upward.

Figure 2:
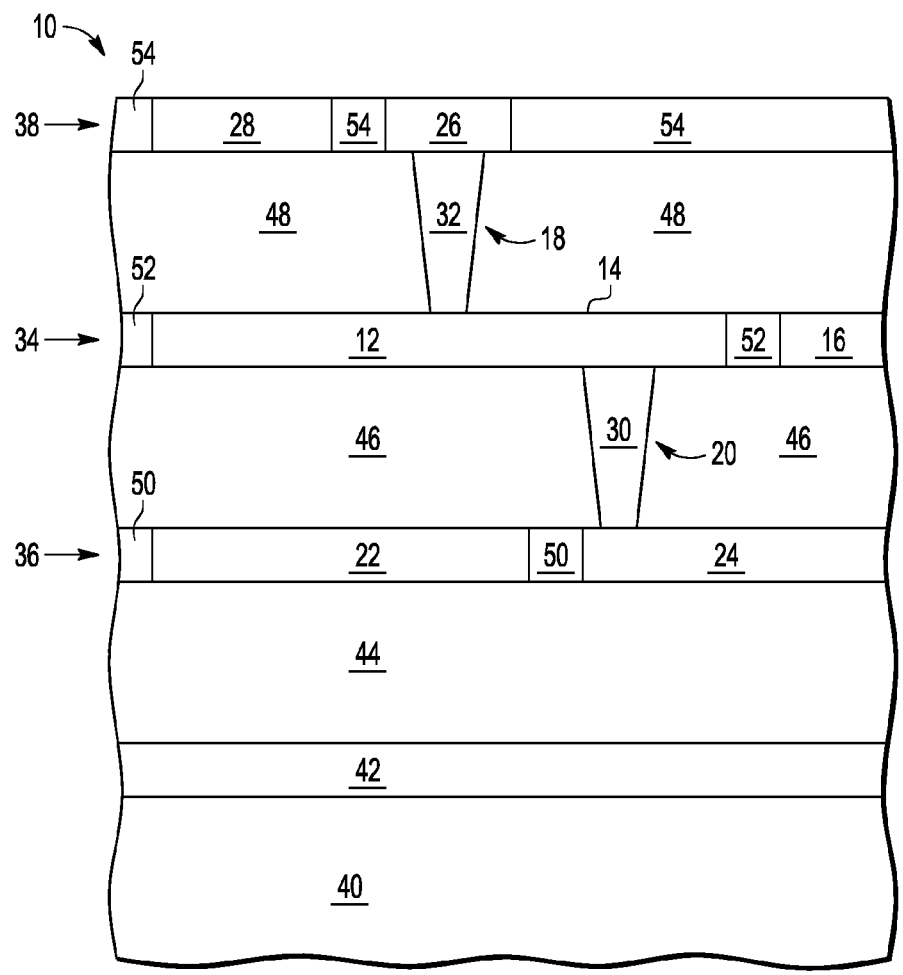
FIG. 2 is a cross section of the semiconductor device of FIG. 1.

Shown in FIG. 2 is a cross section of semiconductor device 10 taken through bus 12 including tab 14 and thus also through decoy via 18, decoy via 20, and bus 16. Also shown are metal portions 22, 24, 26, and 28 and via fill 30 and via fill 32. Buses 12 and 16 are formed in an interconnect layer 34. Metal portions 22 and 24 are formed in an interconnect layer 36. Metal portions 26 and 28 are formed in an interconnect layer 38. Also shown is a substrate 40, an active circuit layer 42 over substrate 40, an interlayer dielectric (ILD) 44 over active circuit layer 42, a dielectric layer 50 in which interconnect layer 36 is formed, an ILD 46 between interconnect layers 34 and 36, a dielectric layer 52 in which interconnect layer 34 is formed, an ILD 48 between interconnect layers 34 and 38, and a dielectric layer 54 in which interconnect layer 38 is formed. Via 18 is formed by forming a via opening in ILD 48 which is filled with via fill 32. Metal portion 26 is formed over and in contact with via fill 32. Via 20 is similarly formed by forming a via opening in ILD 46 which is filled with via fill 30. Bus 12, which is a portion of interconnect layer 34, is formed over and in contact with via fill 30. Bus 12 performs a circuit function such as carrying a signal as does metal portion 24; thus the name for functional via 20. Metal portion 26, on the other hand, is not further connected to additional circuitry; thus the name for decoy via 18. Via fill 30 and via fill 32 may be formed at the same time as interconnect layer 34 and 38, respectively, for example in a dual damascene patterning.

As shown in FIGS. 1 and 2, decoy via 18 is aligned to a position adjacent to via 20. This is an effective position because it is in the path of vacancies originating from the main portion of bus 12. The gettering of these vacancies by decoy via 18 may cause an open between via 18 and bus 12 which is not a problem because decoy via 18 is not a functional via in that the circuitry does not rely on via 18 providing a current path. The vacancies that are on a path to the interface between via 20 and metal portion 24 collect at decoy via 18 instead of functional via 20. A redundant via or decoy via under bus 12 directly adjacent to functional via 20 is not a possibility because of the presence of metal portion 22. This shows the value of being able to provide a decoy via between different interconnect layers than the interconnect layers to which functional via 20 is connected. Also as shown in FIG. 2, there is no space available for a decoy via or redundant via on the opposite side of via 20. It may be beneficial to have a decoy via connected between metal portion 24 and active circuit layer 42 but that would not replace the need for decoy via 18 in this example where vacancies are coming from wide bus 12 into tab 14. Assuming vacancies are not coming from metal portion 24 toward the bottom of via 20, then it may be beneficial to add a decoy via directly over via 20 which could be to replace decoy via 18 or add to decoy via 18. On the other hand, vacancies coming from metal portion 24 would be a threat to damage the interface between via 20 and metal portion 24 and thus a decoy via would be beneficial on metal portion 24 near but not aligned with functional via 20. It is undesirable in that situation to have functional via 20 stacked on the added decoy via. The added decoy via should be offset from the functional via. The intent is to have sufficient decoy via protection to prevent excessive vacancies from reaching the functional via and thus preserving the functional via. This location that is sufficient for providing protection may be called the protection region. Thus, the decoy via is placed in the protection region, which may include being aligned to the functional via, in order to maintain the integrity of the functional via.

By now it should be appreciated that there has been provided a method of forming a decoy via and a functional via. The method includes forming the functional via between a metal portion of a first interconnect layer and a portion of a second interconnect layer. The method further includes forming the decoy via in a protection region between the metal portion of the first interconnect layer and a metal portion of a third interconnect layer. The method has a further characterization by which the first interconnect layer is over the second interconnect layer. The method may have a further characterization by which the first interconnect layer is over the third interconnect layer. The method may have a further characterization by which the first interconnect layer is formed by forming a plurality of metal portions in a first dielectric layer, the second interconnect layer is formed by forming a plurality of metal portions in a second dielectric layer, and the third interconnect layer is formed by forming a plurality of metal portions in a third dielectric layer. The method may have a further characterization by which the functional via is formed after forming the second interconnect layer. The method may have a further characterization by which the portion of the first interconnect layer is a bus having a tab, wherein the functional via contacts the tab. The method may have a further characterization by which the decoy via is aligned adjacent to the functional via. The method may have a further characterization by which the plurality of metal portions in the first dielectric layer comprise copper. The method may have a further characterization by which no space is available for a redundant via directly adjacent to the functional via. The method may have a further characterization by which no space within the protection region is available in the first interconnect layer for a via.

Also disclosed is a semiconductor device. The semiconductor device includes a first interconnect layer having a plurality of metal portions including a first metal portion. The semiconductor device further includes a second interconnect layer having plurality of metal portions including a second metal portion. The semiconductor device further includes a third interconnect layer having a plurality of metal portions including a third metal portion. The semiconductor device further includes a functional via coupled to the first metal portion and the second metal portion. The semiconductor device further includes a decoy via in a protection region around the functional via coupled to the first metal portion and the third metal portion. The semiconductor device may have a further characterization by which the first interconnect layer is over the second interconnect layer. The semiconductor device may have a further characterization by which the first interconnect layer is over the third interconnect layer. The semiconductor device may have a further characterization by which the first metal portion comprises a bus with a tab, wherein the functional via is coupled to the tab. The semiconductor device may have a further characterization by which the decoy via is coupled to the tab. The semiconductor device may have a further characterization by which the functional via extends from a bottom side of the tab and the decoy via is in contact with a top side of the tab. The semiconductor device may have a further characterization by which the decoy via is aligned adjacent to the functional via. The semiconductor device may have a further characterization by which no space is available for a via directly adjacent to the functional via.

Disclosed also is a method. The method includes forming a first interconnect layer having a plurality of metal portions including a first metal portion. The method further includes forming a first interlayer dielectric over the first interconnect layer. The method further includes forming a second interconnect layer over the first interlayer dielectric having plurality of metal portions including a second metal portion, wherein during the forming the second interconnect layer forming a functional via through the first interlayer dielectric from the second metal portion to the first metal portion. The method further includes forming a second interlayer dielectric layer over the second interconnect layer. The method further includes forming a third interconnect layer over the second interlayer dielectric layer having a plurality of metal portions including a third metal portion, wherein during the forming the third interconnect layer forming a decoy via through the second interlayer dielectric layer from the third metal portion to the second metal portion, wherein the decoy via within a protection region of the functional via. The method may have a further characterization by which no space within the protection region is available in the second interconnect layer for a via in addition to the functional via.

Although the invention is described herein with reference to specific embodiments, various modifications and changes can be made without departing from the scope of the present invention as set forth in the claims below. For example, a functional via on a large plate may have similar obstacles to decoy vias or redundant vias as shown in FIG. 2 so that even in the case of the large plate it could be beneficial to provide a decoy via between different interconnect levels than the interconnect levels to which the functional via is connected. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a decoy via and a functional via, comprising:

forming the functional via between a metal portion of a first interconnect layer and a portion of a second interconnect layer, wherein the functional via is susceptible to failure due to vacancies in the metal portion of the first interconnect layer accumulating at the functional via in the absence of the decoy via; and forming the decoy via in a protection region between the metal portion of the first interconnect layer and a metal portion of a third interconnect layer to prevent excessive vacancies from reaching the functional via, wherein the metal portion of the third interconnect layer is not connected to any further circuitry, and the accumulation of vacancies at the decoy via may cause a failure in the decoy via, wherein:

the first interconnect layer is formed by forming a plurality of metal portions in a first dielectric layer, the second interconnect layer is formed by forming a plurality of metal portions in a second dielectric layer, and the third interconnect layer is formed by forming a plurality of metal portions in a third dielectric layer;

the functional via is formed after forming the second interconnect layer;

the portion of the first interconnect layer is a bus having a tab, wherein the functional via contacts the tab;

the decoy via is aligned adjacent to the functional via; and no space is available for a redundant via directly adjacent to the functional via.

2. The method of claim 1, wherein no space within the protection region is available in the first interconnect layer for a via.

3. A semiconductor device, comprising:
a first interconnect layer having a plurality of metal portions including a first metal portion;
a second interconnect layer having plurality of metal portions including a second metal portion;
a third interconnect layer having a plurality of metal portions including a third metal portion;
a functional via coupled to the first metal portion and the second metal portion; and
a decoy via in a protection region around the functional via coupled to the first metal portion and the third metal portion to prevent excessive vacancies from reaching the functional via, wherein the metal portion of the third interconnect layer is not connected to any further circuitry;
wherein the functional via is susceptible to failure due to vacancies in the metal portion of the first interconnect layer accumulating at the functional via in the absence of the decoy via, and the accumulation of vacancies at the decoy via may cause a failure in the decoy via;
wherein the first interconnect layer is over the third interconnect layer; and
wherein the first metal portion comprises a bus with a tab, wherein the functional via is coupled to the tab.

4. The semiconductor device of claim 3, wherein the decoy via is coupled to the tab.

5. The semiconductor device of claim 4, wherein the functional via extends from a bottom side of the tab and the decoy via is in contact with a top side of the tab.

6. The semiconductor device of claim 5, wherein the decoy via is aligned adjacent to the functional via.

7. The semiconductor device of claim 6, wherein no space is available for a via directly adjacent to the functional via.

8. A method, comprising:
forming a first interconnect layer having a plurality of metal portions including a first metal portion;
forming a first interlayer dielectric over the first interconnect layer;
forming a second interconnect layer over the first interlayer dielectric having plurality of metal portions including a second metal portion, wherein during the forming the second interconnect layer forming a functional via through the first interlayer dielectric from the second metal portion to the first metal portion;
forming a second interlayer dielectric layer over the second interconnect layer; and
forming a third interconnect layer over the second interlayer dielectric layer having a plurality of metal portions including a third metal portion, wherein during the forming the third interconnect layer forming a decoy via through the second interlayer dielectric layer from the third metal portion to the second metal portion, wherein the decoy via within a protection region of the functional via and the metal portion of the third interconnect layer is to prevent excessive vacancies from reaching the functional via and is not connected to any further circuitry;
wherein the functional via is susceptible to failure due to vacancies in the metal portion of the first interconnect layer accumulating at the functional via in the absence of the decoy via, and the accumulation of vacancies at the decoy via may cause a failure in the decoy via.

9. The method of claim 8 wherein no space within the protection region is available in the second interconnect layer for a via in addition to the functional via.

* * * * *